(12) United States Patent
Bruckhaus

(10) Patent No.: US 8,878,542 B2
(45) Date of Patent: Nov. 4, 2014

(54) METHOD AND APPARATUS FOR DEALING WITH FAULTS IN AN ELECTRICAL DRIVE SYSTEM

(75) Inventor: Tim Bruckhaus, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 493 days.

(21) Appl. No.: 13/078,160

(22) Filed: Apr. 1, 2011

(65) Prior Publication Data

US 2012/0249155 A1   Oct. 4, 2012

(51) Int. Cl.

| | |
|---|---|
| *G01R 31/00* | (2006.01) |
| *B60L 3/04* | (2006.01) |
| *B60L 3/00* | (2006.01) |
| *G01R 31/42* | (2006.01) |

(52) U.S. Cl.
CPC .............. *B60L 3/003* (2013.01); *G01R 31/42* (2013.01); *B60L 3/04* (2013.01); *B60L 3/0069* (2013.01)
USPC ........................................................ 324/500

(58) Field of Classification Search
USPC .................... 324/537, 500, 765.01
See application file for complete search history.

(56) References Cited

U.S. PATENT DOCUMENTS

| 2002/0105335 A1* | 8/2002 | Mir et al. ...................... 324/503 |
| 2006/0056206 A1* | 3/2006 | Kifuku et al. ..................... 363/15 |
| 2008/0272762 A1* | 11/2008 | Kurahashi et al. ......... 324/103 R |
| 2009/0015973 A1* | 1/2009 | Trunk et al. ...................... 361/42 |
| 2009/0309575 A1* | 12/2009 | Suzuki et al. ............... 324/140 R |
| 2010/0202089 A1 | 8/2010 | Kuehner et al. |
| 2010/0204885 A1* | 8/2010 | Kajino et al. .................... 701/37 |
| 2010/0283500 A1* | 11/2010 | Zeh et al. ................ 324/765.01 |
| 2011/0018578 A1* | 1/2011 | Bae et al. ................ 324/764.01 |
| 2011/0040519 A1* | 2/2011 | Yeh et al. ...................... 702/145 |
| 2012/0235622 A1* | 9/2012 | Welchko et al. .............. 318/722 |

FOREIGN PATENT DOCUMENTS

| DE | 102006003254 A1 * | 7/2007 |
| DE | 102007020509 | 11/2008 |

\* cited by examiner

*Primary Examiner* — Patrick Assouad
*Assistant Examiner* — Demetrius Pretlow
(74) *Attorney, Agent, or Firm* — Michael Best & Friedrich LLP

(57) ABSTRACT

A method for dealing with faults in an electrical drive system having an electrical machine and a pulse-controlled inverter which has a first and a second supply connection, the method including the steps of: detecting a first fault in the electrical drive system; selecting a first of a large number of circuit states (22, 23, 24) of the pulse-controlled inverter according to the detected first fault; and driving the pulse-controlled inverter to set the first circuit state (23), with the circuit states (22, 23, 24) including a short circuit (23) between the power connections of the electrical machine and the first supply connection, a short circuit (24) between the power connections of the electrical machine and the second power connection, and a free-running mode (22).

4 Claims, 1 Drawing Sheet

METHOD AND APPARATUS FOR DEALING WITH FAULTS IN AN ELECTRICAL DRIVE SYSTEM

BACKGROUND OF THE INVENTION

The invention relates to a method for dealing with faults in an electrical drive system having an electrical machine and a pulse-controlled inverter, to an apparatus for driving a pulse-controlled inverter, and to an electrical drive system having an electrical machine and a pulse-controlled inverter.

Electrical machines having pulse-controlled inverters are used, for example, in hybrid vehicles, where they are operated selectively in motor or generator mode. In motor mode, the electrical machine generates an additional drive torque which assists the internal combustion engine, for example in an acceleration phase, and, in generator mode, said electrical machine generates electrical energy which is stored in an energy storage means, for example a battery or a supercap. The mode of operation and the power of the electrical machine are set by means of the pulse-controlled inverter.

Known pulse-controlled inverters comprise a series of switches with which the individual phases of the electrical machine are switched selectively to a high potential, the so-called intermediate circuit voltage, or to a low reference potential, in particular to earth. The switches are driven by an external controller which calculates a desired operating point for the electrical machine as a function of the driver input (acceleration or braking). The pulse-controlled inverter is connected to the controller and receives the relevant operating data and/or control commands from said controller.

In the event of a disturbance or a fault, for example when the battery current is too high or the feed current is too high, the pulse-controlled inverter is switched to a safe state in order to prevent possible damage to electrical components. In this case, different circuit states can be implemented in conventional methods.

In a first method, all the switches which are connected to the low potential, so-called low-side switches, are closed and all the switches which are connected to the high potential, so-called high-side switches, are open. This mode of operation is also called the short circuit state to low potential. In another disconnection method, all the switches of the pulse-controlled inverter are open. This is also called the free-running mode.

DE 10 2006 003 254 A1, for example, discloses a combination of these disconnection methods: since, for example, the phase current can still rise for a short time after the changeover to the short circuit state, said document proposes using the two known disconnection modes of operation sequentially and to switch the electrical machine initially to the free-running mode and then to the short circuit state.

DE 10 2007 020 509 A1 likewise proposes, in the event of a fault occurring in a drive system with a synchronous motor, a free-running mode initially being set and then a short circuit of the supply connections of the synchronous motor to earth being set, depending on the type of fault.

However, fault patterns in the case of which a short circuit to low potential does not represent a safe disconnection state of the electrical drive system or of the electrical machine, for example in the case of low-impedance defects in high-side switches in the pulse-controlled inverter, can occur in electrical drive systems. In such cases, a short circuit state to low potential would cause a short circuit of the supply voltage of the pulse-controlled inverter, and this can lead to further massive damage to the electrical drive system.

There is therefore a need for solutions which can ensure the safety and robustness of an electrical drive system in all fault situations.

SUMMARY OF THE INVENTION

The present invention therefore provides a method for dealing with faults in an electrical drive system having an electrical machine and a pulse-controlled inverter which has a first and a second supply connection, said method comprising the steps of detecting a first fault in the electrical drive system, selecting a first of a large number of circuit states of the pulse-controlled inverter according to the detected first fault, and driving the pulse-controlled inverter to set the first circuit state. In this case, the circuit states comprise a short circuit between the power connections of the electrical machine and the first supply connection, a short circuit between the power connections of the electrical machine and the second supply connection, and a free-running mode. As a result, different disconnection states of the electrical machine can be flexibly selected, depending on the fault which occurs, without there being any risk of further damage to the electrical drive system due to an unsafe disconnection state. In particular, the method according to the invention also has the advantage of being able to react to faults or defects in switching devices in the pulse-controlled inverter and to select a corresponding safe circuit state.

According to an advantageous embodiment, a second fault in the electrical drive system is detected, this second fault occurring in addition to the first fault, a second of the large number of circuit states of the pulse-controlled inverter is selected according to the detected second fault, and the pulse-controlled inverter is driven to change from the first circuit state to the second circuit state. This provides the advantage of changing to an end state which is safe for the electrical machine and the electrical drive system, depending on the type of fault. In particular, a circuit state which is best for ensuring the safety of the drive system can be selected when a plurality of faults occur.

In this case, the pulse-controlled inverter can advantageously be driven in such a way that changing from the first circuit state to the second circuit state comprises changing from the first circuit state to a third circuit state and, after a predetermined period of time, changing from the third circuit state to the second circuit state. In this way, the third circuit state can serve, to a certain extent, as a safe buffer state between the first circuit state and the second circuit state.

According to an advantageous embodiment, the first circuit state is, in this case, a short circuit between the power connections of the electrical machine and a supply potential, the second circuit state is a short circuit between the power connections of the electrical machine and a reference potential, and the third circuit state is a free-running mode of the pulse-controlled inverter. As a result, a switching delay of switches of the pulse-controlled inverter when changing from the short circuit with the supply voltage of the pulse-controlled inverter to a short circuit to low potential, and vice versa, can firstly be compensated for, that is to say overlapping of connection and disconnection processes of the switches in one phase, which overlapping could lead to brief high current flows, can be reliably avoided by intermediately switching to the free-running mode. Secondly, any phase currents, which may occur, in the power connections of the electrical machine can advantageously be eliminated as a result.

The invention further provides an apparatus for driving a pulse-controlled inverter, which has a first and a second supply connection, of an electrical drive system having an electrical machine, said apparatus having a detection device which is designed to detect a fault in the electrical drive system; a selection device which is designed to select a circuit state from a large number of circuit states of the pulse-controlled inverter according to the detected fault, and a control device which is designed to set the circuit state in the pulse-controlled inverter, with the circuit states comprising a short circuit between the power connections of the electrical machine and the first supply connection, a short circuit between the power connections of the electrical machine and the second supply connection, and a free-running mode.

The apparatus for driving a pulse-controlled inverter in an electrical drive system, said apparatus having an electrical energy source, a pulse-controlled inverter which has a first and a second supply connection and which is connected to the electrical energy source via the first and the second supply connection, and an electrical machine having power connections which are connected to the pulse-controlled inverter, can be provided according to the invention.

Further features and advantages of embodiments of the invention can be found in the following description with reference to the attached drawings.

DETAILED DESCRIPTION

Figure 1:
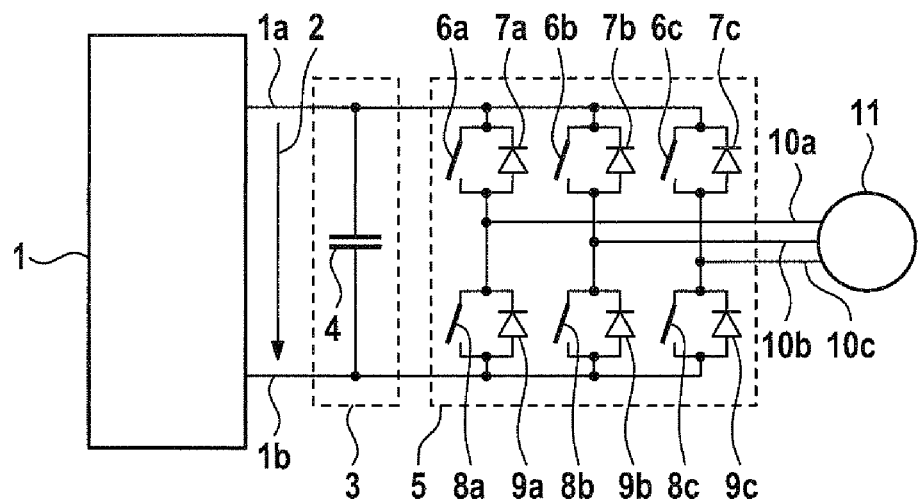
FIG. 1 shows a schematic illustration of an electrical drive system having a pulse-controlled inverter.

FIG. 1 shows a schematic illustration of an electrical drive system. The electrical drive system comprises an energy source 1, for example a high-voltage source such as a fraction battery, which can provide a supply voltage 2. The energy source 1 can be designed, for example, as an energy storage means 1 in a drive system of an electrically operated vehicle. It is also possible for the energy source 1 to be system-based, that is to say for the electrical drive system to draw electrical energy from an energy supply system. The supply voltage 2 can be applied to supply connections of a pulse-controlled inverter 5 via an intermediate circuit 3 having an intermediate circuit capacitor 4. In this case, a connection 1a of the energy source 1 is at high potential, and a connection 1b of the energy source 1 is at low potential, for example earth. The pulse-controlled inverter 5 can have, for example, a three-phase output, with a three-phase electrical machine 11 being connected to the pulse-controlled inverter 5 via power connections 10a, 10b, 10c.

To this end, the pulse-controlled inverter 5 can have, in three supply branches, in each case switching devices with switches 6a, 6b, 6c, 8a, 8b, 8c and associated free-wheeling diodes 7a, 7b, 7c, 9a, 9b, 9c which are in each case connected in parallel and arranged in a six-pulse bridge rectifier circuit. In this case, the switches 6a, 6b, 6c are called high-side switches, and the switches 8a, 8b, 8c are called low-side switches. In this case, the switches 6a, 6b, 6c, 8a, 8b, 8c can be, for example, semiconductor switches, for example MOS-FET switches or IGBT switches.

The pulse-controlled rectifier 5 is designed to switch the phase or power connections 10a, 10b, 10c of the electrical machine 11 alternately to a high supply potential 1a, for example the supply voltage 2, or a to low reference potential 1b, for example an earth potential, by means of correspondingly driving the switches 6a, 6b, 6c, 8a, 8b, 8c. The pulse-controlled inverter 5 determines the power and mode of operation of the electrical machine 11 and is correspondingly driven by a controller (not shown in FIG. 1).

The electrical machine 11 can therefore be selectively operated in motor mode or generator mode. In motor mode, said electrical machine generates an additional drive torque which assists an internal combustion engine, for example in an acceleration phase. In generator mode in contrast, mechanical energy can be converted into electrical energy and stored in the energy storage means 1 or returned to an electrical supply system. The intermediate circuit 3, which can comprise the intermediate circuit capacitor 4 for voltage stabilization purposes, serves to supply the supply voltage 2 to the pulse-controlled inverter 5.

Figure 2:
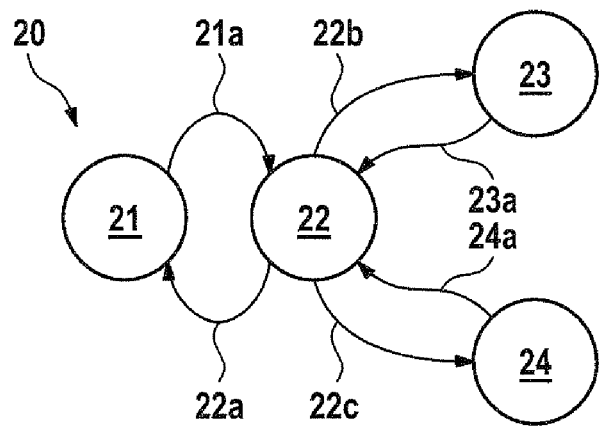
FIG. 2 shows a schematic illustration of a state diagram for different circuit states of a pulse-controlled inverter according to one embodiment of the invention.

FIG. 2 shows a schematic illustration of a state diagram 20 of different operating and circuit states of the electrical drive system shown in FIG. 1. The state 21 is a normal operating state which permits the pulse-controlled inverter 5 to be correspondingly driven when there is no fault or disturbance in the electrical drive system. If a fault is detected, a transition can be made in a state transition 21a from the normal operating state 21 to a free-running mode 22. The free-running mode 22 is characterized in that all the switches 6a, 6b, 6c, 8a, 8b, 8c are open and a current, which may be present in the electrical machine 11, is conducted via the free-wheeling diodes 7a, 7b, 7c, 9a, 9b, 9c and therefore reduced or completely eliminated. The free-running mode 22 can have the disadvantage that the voltage in the intermediate circuit 3 can still rise by 50 V and more after the state transition 21a, as a result of which, for example, the energy source 1 or other components can be damaged.

It is therefore advantageous when the free-running mode 22 is left after a certain period of time. If the fault has already been eliminated or is no longer detected, a transition can be made back to the normal operating state 21 in a state transition 22a. If, however, the fault remains, a state transition to a safe short circuit state can be provided, starting from the free-running mode 22.

To this end, one of the circuit states 23 or 24, to which a transition can be made from the free-running mode 22 by means of state transitions 22b and 22c, is selected as a function of the type of fault detected. In this case, the circuit state 23 is a short circuit state 23 to low potential 1b, for example to a reference potential such as an earth potential. In the short circuit state 23, the low-side switches 8a, 8b, 8c are closed, while the high-side switches 6a, 6b, 6c are open. In this state, the power connections 10a, 10b, 10c are therefore in each case connected to the low potential 1b. As a result, current can flow through the free-wheeling diodes 9a, 9b, 9c and the low-side switches 8a, 8b, 8c. The circuit state 24 is, in contrast, a short circuit state 24 to high potential 1a, for example to a supply potential. In the short circuit state 24, the low-side switches 8a, 8b, 8c are open, while the high-side switches 6a, 6b, 6c are closed. In this state, the power connections 10a, 10b, 10c are therefore in each case connected to the high potential 1a. As a result, current can flow through the free-wheeling diodes 7a, 7b, 7c and the high-side switches 6a, 6b, 6c.

The changeover is made from the free-running mode 22 to one of the short circuit states 23 or 24 preferably after a predefined period of time. This period of time preferably has to be adapted to the respective application and can be, for example, 10 ms if a transition is intended to be made from the normal operating state 21 to one of the short circuit states 23 or 24. In the event of a change from one of the short circuit states 23 or 24 to the respectively other short circuit state, it may be advantageous to keep the residence time in the free-running mode 22 as short as possible. In this case, the period of time can be, for example, a few 100 ns, depending on the switching times of the switches 6a, 6b, 6c, 8a, 8b, 8c involved. A time threshold can be prespecified in a simple and cost-effective manner, for example by means of a timer. The period of time can be linked selectively to one or more additional criteria, in particular current and/or voltage states of the energy source 1 or of the electrical machine 11. This has the result that the pulse-controlled inverter 5 remains in the free-running mode 22 for a relatively long time and is changed over from the free-running mode 22 to one of the short circuit states 23 or 24 only when critical current and/or voltage states on the electrical machine 11 or in the electrical supply system which is connected to said electrical machine are reached.

A change can be made from each of the short circuit states 23 and 24 back to the free-running mode 22 by means of state transition 23a and, respectively, 24a. A direct transition from one short circuit state to the respectively other short circuit state is impossible since, depending on switching technology used, the switching processes of the switches 6a, 6b, 6c and 8a, 8b, 8c take a specific amount of time, for example a few hundred nanoseconds, and a temporal overlap between the switching process in the switches of a phase supply branch of the pulse-controlled inverter 5 would short-circuit the high potential 1a with the low potential 1b, and this can lead to damage to or even destruction of the switches involved.

In the case of a change from the short circuit state 23 to the short circuit state 24, provision is therefore made for a state transition 23a to the free-running mode 22 to take place, for the free-running mode 22 to be maintained for a predetermined period of time, and for a change to be made to the short circuit state 24 by means of a state transition 22c after the predetermined period of time has elapsed.

In this case, one of the circuit states 22, 23, or 24 can be selected depending on the type of fault detected. For example, in the case of a low-impedance defect in one of the high-side switches 6a, 6b or 6c, the short circuit state 24 to high potential 1a can be selected as the safe circuit state of the electrical drive system. The short circuit state 23 to low potential 1b would not be a safe circuit state of the electrical drive system in this case since, in the case of a low-impedance defect in a high-side switch 6a, 6b, 6c with the low-side switches 8a, 8b, 8c closed at the same time, a short circuit of the supply voltage of the pulse-controlled inverter 5 would occur and damage to the electrical drive system would not be precluded.

It may also be possible to detect more than one fault and to assign a sequence of different circuit sates 22, 23, and 24 to each fault combination or each fault pattern. An exemplary sequence of events for dealing with faults when a plurality of faults occur is described in the text which follows.

The electrical drive system is initially in the normal operating state 21. After a first fault is detected, it being possible to assign the short circuit state 23 to low potential 1b to said fault as the safe circuit state, a state transition 21a is first made to the free-running mode 22, and a state transition 22b to the short circuit state 23 is made from said free-running mode after a predetermined period of time.

A second fault is detected while the electrical drive system is in the short circuit state 23. The second fault can be, for example, a defect in a high-side switch 6a, 6b or 6c which leads to a short circuit of a phase line 10a, 10b or 10c with the high potential 1a. The short circuit state 24 to high potential 1a can be assigned to this second fault as a safe circuit state. In this case, the electrical drive system changes, by means of a state transition 23a, to the free-running mode 22, and a state transition 22c to the short circuit state 24 to high potential 1a is made from said free-running mode after a predetermined period of time.

If the second fault is eliminated or no longer detected, a transition can be made from the short circuit state 24 back to the free-running mode 22 by means of a state transition 24a. Either a change can be made back to the normal operating state 21 by means of a state transition 22a or a switch can be made to the short circuit state 23 by means of a state transition 22b, depending on whether the first fault is still present.

Figure 3:
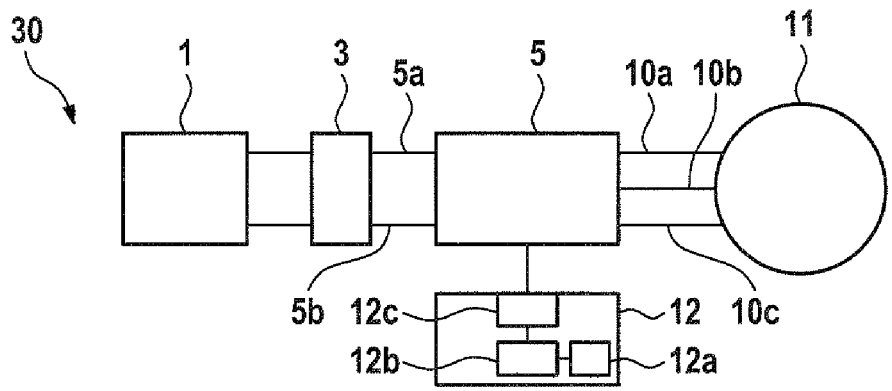
FIG. 3 shows a schematic illustration of an electrical drive system having a pulse-controlled inverter and an apparatus for driving the pulse-controlled inverter according to a further embodiment of the invention.

FIG. 3 shows a schematic illustration of an electrical drive system 30 having a pulse-controlled inverter 5 and an apparatus 12 for driving the pulse-controlled inverter 5. In this case, the pulse-controlled inverter 5 comprises a first supply connection 5b and a second supply connection 5a, which supply connections can in each case be connected to a high potential or to a low potential. In this case, the electrical drive system 30 differs from the electrical drive system shown in FIG. 1 in that an apparatus 12 which is designed to drive the switching devices of the pulse-controlled inverter 5 is provided. To this end, the apparatus 12 comprises a control device 12c with the aid of which corresponding control signals can be applied to the individual switches of the pulse-controlled inverter 5.

The apparatus 12 also comprises a fault detection device 12a which is designed to detect faults in the electrical drive system 30 and to transmit said faults to a selection device 12b. The selection device 12b is designed to select a circuit state or a sequence of circuit states, which are assigned to the corresponding fault pattern, as a function of the detected fault or faults from the detection device 12a. The selection device 12b can also instruct the control device 12c to drive the pulse-controlled inverter 5 in accordance with the selected circuit states.

The apparatus 12 is preferably designed to execute the method, which is explained in connection with FIG. 2, for dealing with faults in the electrical drive system 30. In this case, the control device 12c is designed to implement the circuit states 21, 22, 23 and 24 from FIG. 2.

To this end, the apparatus 12 can be implemented using discrete logic, in a microcontroller, as a programmable logic module, as an ASIC or in combinations of said options.

The invention claimed is:

1. A method for dealing with faults in an electrical drive system (30) having an electrical machine (11) and a pulse-controlled inverter (5) which has a first and a second supply connection (5a, 5b), said method comprising the steps of:
   detecting a first fault in the electrical drive system (30);
   driving, based on the first fault, the pulse-controlled inverter (5) to set a circuit state, wherein the circuit state is a free-running mode (22);
   if the detected first fault is still present in the electrical drive system (30) after a predetermined amount of time, driving the pulse-controlled inverter (5) to set a first short circuit state, selected based on the type of detected first fault, with the short circuit states (23, 24) comprising
   a short circuit (23) between the power connections (10a, 10b, 10c) of the electrical machine (11) and the first supply connection (5b), and
   a short circuit (24) between the power connections (10a, 10b, 10c) of the electrical machine (11) and the second supply connection (5a);

detecting a second fault in the electrical drive system (30), this second fault occurring in addition to the first fault;

selecting a second short circuit state of the short circuit states (23, 24) of the pulse-controlled inverter (5) according to the detected second fault; and driving the pulse-controlled inverter (5) to change from the first short circuit state to the second short circuit state.

2. A method according to claim 1, with the pulse-controlled inverter (5) being driven in such a way that changing from one of the short circuit states (23, 24) to the other short circuit state comprises changing from the first short circuit state (23, 24) to a free running mode circuit state (22) and, after a predetermined period of time, changing from the free-running mode circuit state (22) to the second short circuit state (23, 24).

3. An apparatus (12) for driving a pulse-controlled inverter (5), which has a first and a second supply connection (5a, 5b), of an electrical drive system (30) having an electrical machine (11), said apparatus having:

a detection device (12a) which is designed to detect a first fault in the electrical drive system (30);

a selection device (12b) which is designed to select a first short circuit state of the pulse-controlled inverter (5) based on the type of detected first fault, the short circuit states (23, 24) comprising a short circuit (23) between the power connections (10a, 10b, 10c) of the electrical machine (11) and the first supply connection (5b), and a short circuit (24) between the power supply connections (10a, 10b, 10c) of the electrical machine (11) and the second supply connection (5a); and a control device (12c) which is designed to set the pulse-controlled inverter (5) to a free-running mode (22) upon detection of the first fault, and the first short circuit state if the detected first fault is still present in the electrical drive system (30) after a predetermined amount of time.

4. An electrical drive system (30) having:

an electrical energy source (1);

a pulse-controlled inverter (5) which has a first and a second supply connection (5a, 5b) and which is connected to the electrical energy source (1) via the first and the second supply connection (5a, 5b);

an electrical machine (11) having power connections (10a, 10b, 10c) which are connected to the pulse-controlled inverter (5); and an apparatus (12) comprising a detection device (12a) which is designed to detect a first fault in the electrical drive system (30), a selection device (12b) which is designed to select a first short circuit state of the pulse-controlled inverter (5) based on the type of detected first fault, the short circuit states (23, 24) comprising a short circuit (23) between the power connections (10a, 10b, 10c) of the electrical machine (11) and the first supply connection (5b), and a short circuit (24) between the power supply connections (10a, 10b, 10c) of the electrical machine (11) and the second supply connection (5a), and a control device (12c) which is designed to set the pulse-controlled inverter (5) to a free-running mode (22) upon detection of the first fault, and the first short circuit state if the detected first fault is still present in the electrical drive system (30) after a predetermined amount of time.

\* \* \* \* \*